US008612027B2

(12) United States Patent
Carrillo

(10) Patent No.: US 8,612,027 B2
(45) Date of Patent: Dec. 17, 2013

(54) SEGMENTAL ELECTRONIC CIRCUIT BREAKER AND INSTALLATION COMPRISING SAME

(75) Inventor: Jean-Jacques Carrillo, Montauban (FR)

(73) Assignees: Jean-Jacques Carillo, Montauban (FR); Novatec SA, Montauban (FR)

( * ) Notice: Subject to any disclaimer, the term of this patent is extended or adjusted under 35 U.S.C. 154(b) by 0 days.

(21) Appl. No.: 13/121,757

(22) PCT Filed: Oct. 1, 2009

(86) PCT No.: PCT/FR2009/001174
§ 371 (c)(1),
(2), (4) Date: Oct. 13, 2011

(87) PCT Pub. No.: WO2010/037936
PCT Pub. Date: Apr. 8, 2010

(65) Prior Publication Data
US 2012/0024684 A1 Feb. 2, 2012

(30) Foreign Application Priority Data

Oct. 1, 2008 (FR) ...................................... 08/05433

(51) Int. Cl.
*G05B 11/01* (2006.01)
(52) U.S. Cl.
USPC .............................................. 700/22; 361/65
(58) Field of Classification Search
USPC .................................................... 361/101, 65
See application file for complete search history.

(56) References Cited

U.S. PATENT DOCUMENTS

| 5,754,045 | A | * | 5/1998 | Higuchi | 323/320 |
| 5,856,711 | A | | 1/1999 | Kato et al. | |
| 6,208,041 | B1 | | 3/2001 | Majumdar et al. | |
| 6,347,038 | B1 | * | 2/2002 | Duarte et al. | 361/705 |
| 7,800,875 | B2 | * | 9/2010 | Flay et al. | 361/64 |
| 2004/0252430 | A1 | | 12/2004 | Oumaru et al. | |
| 2005/0225909 | A1 | * | 10/2005 | Yoshizaki et al. | 361/42 |
| 2005/0253457 | A1 | * | 11/2005 | Pierret et al. | 307/10.1 |
| 2007/0103833 | A1 | | 5/2007 | Harris, IV | |
| 2009/0021880 | A1 | * | 1/2009 | Flay et al. | 361/101 |
| 2012/0036374 | A1 | * | 2/2012 | Carrillo | 713/300 |
| 2012/0197453 | A1 | * | 8/2012 | Pugh et al. | 700/293 |

FOREIGN PATENT DOCUMENTS

DE 103 45 556 A1 5/2005
EP 0 664 613 A2 7/1995

OTHER PUBLICATIONS

International Search Report, dated Dec. 23, 2009, from corresponding PCT application.

\* cited by examiner

*Primary Examiner* — Rexford Barnie
*Assistant Examiner* — Angela Brooks
(74) *Attorney, Agent, or Firm* — Young & Thompson

(57) ABSTRACT

A circuit breaker includes several elementary circuit breakers (1) arranged as several segments (2), each suitable for powering several independent loads (3). These provisions make it possible to improve the thermal equilibrium on each segment by distributing the heating over all the segments. The segmental circuit breakers are more particularly suitable for multi-wire networks which power a single load through a multitude of wires of the network in parallel.

15 Claims, 2 Drawing Sheets

SEGMENTAL ELECTRONIC CIRCUIT BREAKER AND INSTALLATION COMPRISING SAME

TECHNICAL DOMAIN

Figure 1:
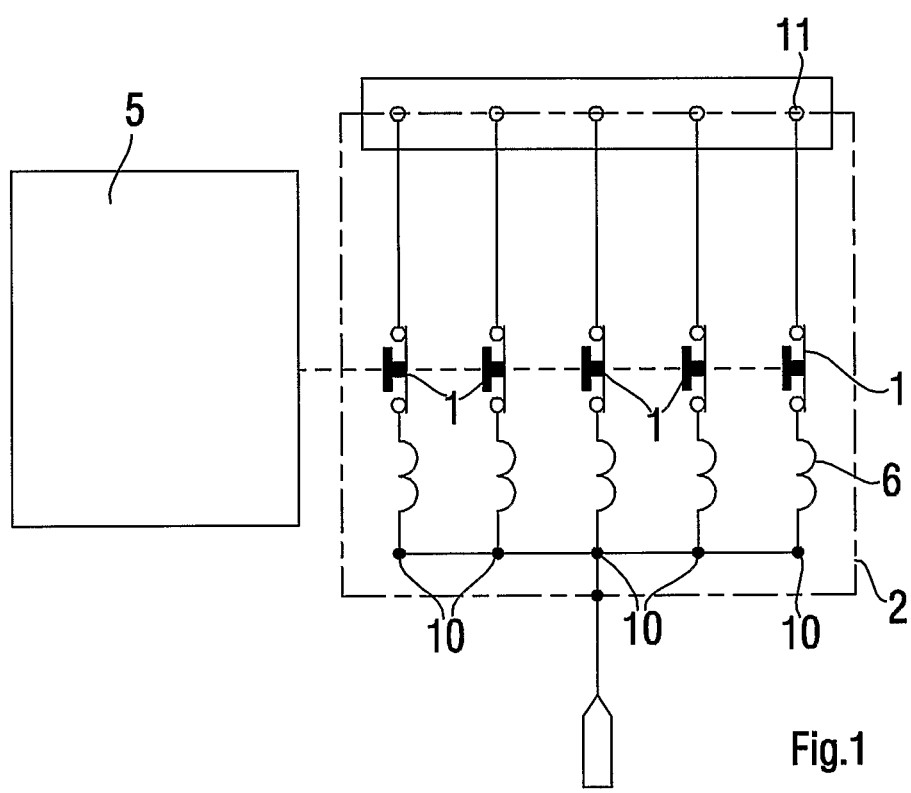

This invention is from the field of materials used in electrical systems. More especially the invention is from the field of materials used to assure functions of protection of the system against overcurrents, overvoltages, undervoltages, differential faults and other electrical faults, and relates to a new type of electronic circuit breaker.

PRIOR ART

Electronic circuit breakers are known from the prior art. These circuit breakers exhibit the advantage over electromechanical circuit breakers of being able to be remotely reset at will and of integrating the relay function in the sense that they can be remotely opened or closed.

These circuit breakers are used in various fields and especially in the field of transportation and others. It is thus that their use in the field of aeronautics to assure the protection of the electrical circuits of aircraft is known.

Certain cards are already equipped with several electronic circuit breakers as described in the referenced patents "US 2007/103833 A1" (Harris Edwin J IV [US]) dated May 10, 2007 (2007-05-10) on the one hand and "U.S. Pat. No. 5,856, 711 A" (Kato Akira [JP] et al). These cards cannot be used as they are for placement in parallel because the triggering of a circuit breaker can only be done based on the knowledge of the set of currents passing through each component of the circuit breaker that is supplying this load. One skilled in the art does not place circuit breakers in parallel without knowing a priori what the current interval will be between these various circuit breakers. Actually, triggering in cascade is systematic to the detriment of the busiest circuit breaker. Operation is completely impossible with electromechanical relays because the time intervals of switching OFF and switching ON would quickly destroy the contacts by starting with the slowest of the relays.

Certain circuits allow balancing of the current in several semi-conductor components in parallel, as described in the patent "U.S. Pat. No. 6,208,041 B1" (Majumdar Gourab [JP] et al) Mar. 27, 2001 (2001-03-27), but these solutions do not meet our needs which are to obtain independent control of each component of the circuit breaker in each of the segments. Moreover these solutions have the drawback of accomplishing balance by limiting the conduction of the most conductive components, which creates a temperature rise and a drop of supplementary voltage. Finally, these solutions eliminate the electrical independence of the segments, which would pose a problem of use with a new electrical network architecture and the segments would no longer be able to comprise the relays described in the patent application that was filed on this same date by the applicant for "New electrical network architecture for confined environments incorporating electrical sources."

The opening capacity of the independent sub-circuit breakers on each of the segments in claim "US 2004/0252430 A1" (Oumaru Takeshi [JP] et al) dated Dec. 16, 2004 (2004-12-16) cannot be applied to the independent segments defined in this document.

To assure the protection function, interruption elements such as, for example, triacs, thyristors, IGBT (insulated gate bipolar transistor), SSPC (static power cutoff element), etc. are generally used.

DESCRIPTION OF THE INVENTION

Technical Problem

The major drawback of these components resides in their high impedance or voltage drop relative to electromechanical components. This high impedance and this voltage drop are expressed by greater temperature rises.

For example the SSPC type electronic circuit breakers installed in complementary or symmetrical stages for alternating current have a still highly increased voltage drop per unit of semiconductor surface area, thus a major temperature rise when these components are used in a permanent mode at significant current values.

If the general case of a primary electrical distribution, domestic electric meter, main distribution busbar for an aircraft, a ship or other means of transport is considered, the maximum current distributed by the primary winding is generally much less than the sum of the currents of each of the secondary protections. This is due to the fact that the rating of a circuit breaker is greater than the consumption of the load that is connected there (a margin of at least 20% is taken) and on the other hand due to the fact that the different loads do not all consume their maximum current at the same time.

However, certain loads can permanently consume a maximum of current while others have a consumption far below the value of the rating used or are only exposed to some consumption peaks. Thus circuit breakers in the overheated state relative to others that will remain cold will be observed; it will result in a very heterogenous distribution of temperature rises and consequently oversizing of radiators all the greater as an effort is made to foresee the most critical cases of use.

Furthermore, forced ventilation can prove necessary to assure good evacuation of the heat released.

Moreover, the failure rate by SSPC on the same circuit breaker card that contains several of them supplying different loads becomes highly variable and the failure rate of the circuit breaker card as a whole suffers from it.

In the most specific case of aeronautics, circuit breaker cards containing SSPCs are used.

To limit the costs, arranging the SSPCs on the same card is known, but as a corollary this arrangement does not offer any connection flexibility and between them links the a priori independent loads on a functional level and in configuration management. This solution has only little effect on the temperature rise problems of an SSPC, and it does not contribute to properly making the heat distribution uniform, since each of the SSPCs is dedicated to the supply of a single load or set of loads, even if several SSPCs are sharing the same radiator.

To again limit the costs and to impart flexibility, being able to program the disconnection thresholds is known. Unfortunately this solution requires definition of a fuse element compatible with the highest caliber of programming and resizing of a radiator in order for it to be able to optimally evacuate the heat that can be released by the maximum supply current allowed for a load itself also maximum. This solution also leads to sizing of the cabling as a function of this fuse element and thus to often uselessly increasing the mass of the latter.

Another drawback of the known circuit breakers of the prior art consists in the impossibility of testing their switching capacity during operation to be assured that they do not have hidden faults opposing their switching.

Technical Solution

The object of this invention is to resolve the cited drawbacks by using a new type of circuit breaker allowing a better distribution of the heat release.

Another object of this invention is the use of a circuit breaker for which the fuse function is matched to the rating used.

Another object of this invention is the possibility of testing the switching capacity of the circuit breaker during operation.

For this purpose, the circuit breaker is characterized in that it is composed of several elementary circuit breakers arranged in at least one segment adapted to supply several independent loads, each elementary circuit breaker having one input and one output.

According to another characteristic of the invention the circuit breaker comprises at least two segments and at least one elementary circuit breaker of each segment is connected by its output to the output of an elementary circuit breaker and just one of the other segment.

According to another characteristic of the invention the different elementary circuit breakers assigned to the supply of a particular load preferably belong to different segments.

Based on these arrangements, the heat released can be distributed over several segments, which is a factor in the uniformity of the core temperatures of the components.

Moreover, because of these arrangements, several elementary circuit breakers are used to supply a load, each of them providing a part of the load supply current. The number of circuit breakers linked to this load according to another characteristic of the invention is determined by the rating of the load. This number will be at least equal to the ratio of the rating provided for the load by the rating of the elementary circuit breaker.

It will be equal to this ratio when the programming of the circuit breakers is done solely using hardware and it will be able to be higher than this ratio when the rating of the loads will be programmable using software.

According to another characteristic of the invention each elementary circuit breaker has a predefined rating, this rating defining the triggering of said circuit breaker. This arrangement makes it possible to use a predetermined fuse function by elementary circuit breaker and is perfectly matched to the rating of this elementary circuit breaker.

According to another characteristic of the invention, each elementary circuit breaker can be remotely activated in the direction of switching OFF or switching ON. This arrangement makes it possible to test the switching capacity of each of the elementary circuit breakers linked to the same load in a sequential manner. Because of this sequential, very brief and repeated switching (one single elementary circuit breaker opens at a time), the supply of the load is not affected by it, the latter being supplied by the other elementary circuit breakers. The duration of this switching OFF will be preferably less than 100 milliseconds. As for an alternating current, it will be preferably less than one period. This duration can likewise be used for variable adjustment of intrinsic and extrinsic imbalances of the elementary circuit breakers and of their connections assigned to the same load.

The invention also has as its object a system containing at least one new type of circuit breaker.

This system according to a characteristic of the invention has a means of controlling the switching OFF of each elementary circuit breaker in a sequenced manner, said means switching OFF and switching ON in turn each elementary circuit breaker of the same load.

According to another characteristic of the invention the circuit breaker is characterized in that:

it is composed of several elementary circuit breakers arranged in at least two segments, each electrically segregated, suited to supplying several independent loads, each elementary circuit breaker having one input and one output, at least one elementary circuit breaker of each segment is connected by its output to the output of one elementary circuit breaker and just one of the other segment, at least two elementary circuit breakers assigned to the supply of one particular load belong to different segments, said circuit breaker triggering based on the sum of the information of the different segments.

Each circuit breaker segment is electrically independent of the other segments up to its outputs, making it possible in the case of failure of one of them not to affect the other segments and to assure an electrical segregation with other segments connected to another generator for use of the segments within the framework of dynamic assignments of load as described in the patent application that was filed on this same date by the applicant for "New electrical network architecture for confined environments incorporating electrical sources."

SUMMARY DESCRIPTION OF THE FIGURES AND DRAWINGS

Figure 2:
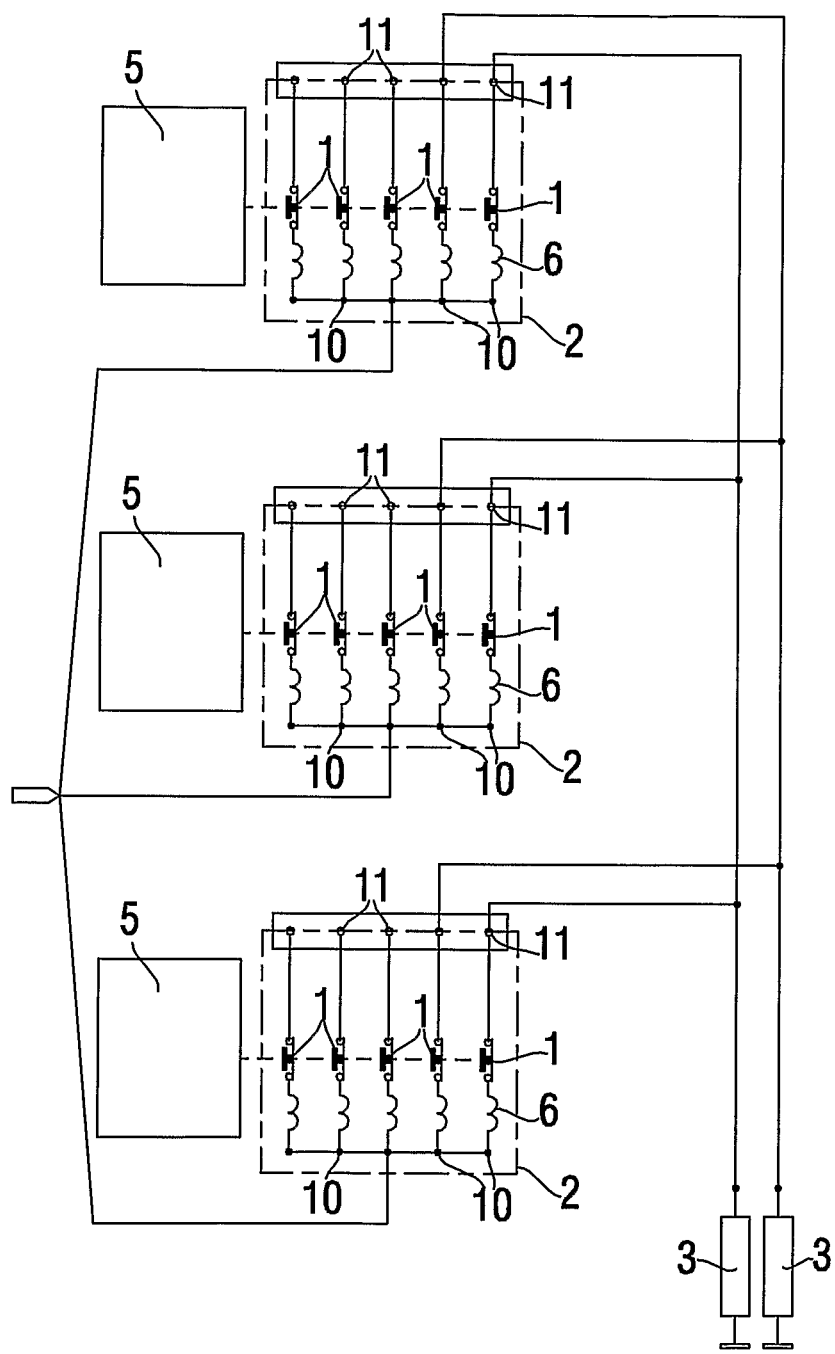

Other advantages and characteristics of the invention will become apparent from reading the description of a preferred embodiment given as a nonlimiting example with reference to the attached drawings in which:

FIG. 1 is a schematic view of a circuit breaker according to the invention, composed of a single segment, FIG. 2 is a schematic view of an electrical system using a circuit breaker according to the invention, comprising several segments.

OPTIMUM IMPLEMENTATION OF THE INVENTION

As shown, the new type of circuit breaker is composed of several elementary circuit breakers 1 arranged in at least one segment 2 that is suitable for supplying one or more independent loads 3, each elementary circuit breaker 1 having an electric power input 10 designed to be connected to a conductor of an electric power supply network and an output 11 designed to be connected to a load 3. Each segment 2 is formed by a single circuit or in a single component or on the same semiconductor slice.

In the embodiment shown in the attached figures, the circuit breaker according to the invention supplies several loads 3 and comprises at least two segments 2, the inputs 10 of the elementary circuit breakers 1 of each segment 2 being electrically connected to one another and being designed to be connected to a conductor of an electric power supply network.

The output 11 of each elementary circuit breaker 1 of each segment 2 is electrically connected to the output 11 of one elementary circuit breaker of the other segment. Thus each load 3 is supplied via several elementary circuit breakers 1, these different circuit breakers belonging to different segments 2. In the embodiment of FIG. 2, each load is supplied by three elementary circuit breakers 1 of three different segments 2.

Alternatively, it will be possible to envisage that at least two elementary circuit breakers 1 assigned to the supply of the same load 3 belong to the same segment 2.

Each elementary circuit breaker 1 has a predefined rating, preferably nonprogrammable. One conventional protection fuse element 6, known in the art, belonging or not to the segment 2, and whose rating is predetermined and matched to the rating of the elementary circuit breaker 1, is linked to each elementary circuit breaker 1.

The number of elementary circuit breakers 1 assigned to a load 3, i.e. to its supply, is determined by the rating assigned to this load 3, the sum of the ratings of the elementary circuit breakers 1 being at least equal to the rating assigned to the load 3.

Advantageously, each elementary circuit breaker 1 can be remotely actuated in the direction of switching OFF or switching ON either by an electrical signal or by an optical signal delivered by a management and control means 5.

Each elementary circuit breaker 1 is connected to a means, not shown, for measuring the current intensity that passes through it. The value of the intensity of this current is transmitted by a suitable analog or digital transmission means, not shown, to a centralized means of management of the disconnection, common to all the elementary circuit breakers of the same load, this means being able to be the management and control means 5. This arrangement allows the centralized management means to calculate the triggerings for a given load. The centralized management, moreover, makes it possible to correlate the different current measurements between the different segments 2 in order to detect measurement errors. The centralized management likewise makes possible synchronous triggering of all the elementary circuit breakers 1 linked to the same load 3, in particular for multiphase loads, and the triggering must take place synchronously on all the phases.

Each segment 2 can be linked to a supplementary means, not shown, for measuring the intensity of the current that is flowing into the latter.

Also, each elementary circuit breaker 1 will be able to be linked to a means, not shown, of measuring the voltage at least one of the input 10 and output 11 terminals of each elementary circuit breaker 1. The value of this voltage is transmitted by an analog or digital transmission means, not shown, and that is matched to the means 5 of centralized management of the disconnection that is common to all the elementary circuit breakers 1 of the same load.

This arrangement makes it possible to determine other triggering or control factors based on the voltage, to allow the location of faults and to analyze the surrounding network and its faults.

These different means of measuring current and voltage can be external to the component or internal.

FIG. 2 shows a system designed to supply electric power to at least one electrical load 3 comprising a circuit breaker in segments 2 as described.

This system has a means of controlling the switching OFF of each elementary circuit breaker 1 in a sequenced manner, said means switching OFF and switching ON in turn each elementary circuit breaker 1 of the same load 3. This arrangement makes it possible to test the switching capacity of the circuit breakers for each of the loads.

This control means can be advantageously composed of means 5 for management of the above described disconnection.

Advantageously the elementary circuit breakers 1 can constitute the relays described in the patent application that was filed on this same date by the applicant for "New electrical network architecture for confined environments incorporating electrical sources."

It goes without saying that this invention can accommodate all arrangements and variants from the area of technical equivalents without, thereby, going outside the scope of this patent.

The invention claimed is:

1. A circuit breaker comprising:
   plural segments, including a first segment and a second segment, each of said plural segments being formed by a single circuit board or in a single component or on a same wafer;
   each of said plural segments having a plurality of elementary circuit breakers that each has one input and one output, each of said plurality of elementary circuit breakers being assigned to a supply of one respective load;
   at least one of said elementary circuit breakers of said first segment being connected by its output to the output of one of said elementary circuit breakers of said second segment; and
   a centralized management making it possible to calculate the triggering of said elementary circuit breakers assigned to the one respective load.

2. The circuit breaker according to claim 1, wherein each said elementary circuit breaker has a predefined rating.

3. The circuit breaker according to claim 2, wherein a number of said elementary circuit breakers assigned to the one respective load is determined by the rating assigned to the one respective load, wherein a sum of the ratings of said elementary circuit breakers assigned to the one respective load is at least equal to the rating assigned to the one respective load.

4. The circuit breaker according to claim 3, wherein at least two of said elementary circuit breakers assigned to the supply of the one respective load belong to a same one of said segments.

5. The circuit breaker according to claim 2, wherein at least two of said elementary circuit breakers assigned to the supply of the one respective load belong to a same one of said segments.

6. The circuit breaker according to claim 1, wherein the inputs of the elementary circuit breakers of each of said segments are connected to one another.

7. The circuit breaker according to claim 1, wherein each of said elementary circuit breakers is adapted to be remotely switched.

8. The circuit breaker according to claim 1, wherein each of said elementary circuit breakers is connected to a means for measuring the intensity of the current that passes through the respective said elementary circuit breaker and for transmitting a value of the measured intensity of the current in an analog or digital manner to a means of centralized management of the disconnection, common to all the elementary circuit breakers of the one respective load.

9. The circuit breaker according to claim 1, wherein each of said elementary circuit breakers is linked to a means of measuring the voltage to at least one of the input and output terminals of each of said elementary circuit breakers and for transmitting a value of the measured voltage by an analog or digital transmission means to a means of centralized management of the disconnection, common to all the elementary circuit breakers of the one respective load.

10. The circuit breaker according to claim 1, wherein each of said segments is linked to a means for measuring the intensity of the current that is flowing into the respective segment.

11. The circuit breaker according to claim 1, wherein each of said segments is formed by a single component.

12. An electrical system designed to supply at least one electric load, wherein it is equipped with at least one circuit breaker according to claim 1.

13. The system according to claim 12, comprising means of controlling the switching of each of said elementary circuit breakers in a sequenced manner, said means switching OFF and ON in turn each of said elementary circuit breakers of the one respective load.

14. The system according to claim 13, wherein the duration of the switching OFF of each of said elementary circuit breakers is adjustable.

15. The circuit breaker according to claim 1, where said elementary circuit breakers are adapted to supply at least two loads.

* * * * *

UNITED STATES PATENT AND TRADEMARK OFFICE
CERTIFICATE OF CORRECTION

PATENT NO. : 8,612,027 B2  Page 1 of 1
APPLICATION NO. : 13/121757
DATED : December 17, 2013
INVENTOR(S) : Jean-Jacques Carrillo It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 146 days.

Signed and Sealed this
Twenty-second Day of September, 2015

Michelle K. Lee
*Director of the United States Patent and Trademark Office*